(12) United States Patent
Jung et al.

(10) Patent No.: US 11,778,875 B2
(45) Date of Patent: Oct. 3, 2023

(54) DISPLAY PANEL HAVING INCLINED EDGE DEFINED BY RESPECTIVE END SURFACES OF BASE SUBSTRATE AND INSULATING LAYER, AND DISPLAY DEVICE INCLUDING THE SAME

(71) Applicant: Samsung Display Co., LTD., Yongin-si (KR)

(72) Inventors: Kwang-Chul Jung, Seoul (KR); Youngrae Kim, Cheonan-si (KR); Dong-Yoon So, Hwaseong-si (KR); Kyungmin Park, Seongnam-si (KR); Samho Ihm, Seoul (KR); Yongjun Jo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 396 days.

(21) Appl. No.: 17/182,566

(22) Filed: Feb. 23, 2021

(65) Prior Publication Data

US 2021/0313411 A1    Oct. 7, 2021

(30) Foreign Application Priority Data

Apr. 3, 2020 (KR) .................. 10-2020-0040717

(51) Int. Cl.
  *H10K 59/131* (2023.01)
  *H01L 23/00* (2006.01)
(52) U.S. Cl.
  CPC .......... *H10K 59/131* (2023.02); *H01L 24/06* (2013.01); *H01L 2224/06515* (2013.01)

(58) Field of Classification Search
  CPC ...... H10K 59/12; H10K 59/131; H01L 24/06; H01L 2224/06515
  (Continued)

(56) References Cited

U.S. PATENT DOCUMENTS

| 10,446,789 B2 | 10/2019 | Kim et al. |
| 2014/0138651 A1* | 5/2014 | Oh ...................... H10K 59/122 438/23 |

(Continued)

FOREIGN PATENT DOCUMENTS

| KR | 100880936 B1 | 2/2009 |
| KR | 1020170081058 A | 7/2017 |

(Continued)

*Primary Examiner* — Matthew E. Gordon
(74) *Attorney, Agent, or Firm* — CANTOR COLBURN LLP

(57) ABSTRACT

A display device includes a base substrate including: a display region including a pixel, and a pad region defining an end surface of the base substrate which is furthest from the display region and exposed outside the display panel; an insulating layer in the display region and the pad region; and in the pad region: a signal pad electrically connected to the pixel and to a dummy pad; the insulating layer covering the signal pad and the dummy pad and defining an end surface of the insulating layer which is furthest from the display region and exposed outside the display panel; and a first opening in the insulating layer which exposes the signal pad outside the insulating layer and outside the display panel. In the pad region, the end surfaces of the base substrate and the insulating layer together define an inclined edge of the display panel.

20 Claims, 8 Drawing Sheets

(58) Field of Classification Search
USPC .................................................. 257/40, 773
See application file for complete search history.

(56) References Cited

U.S. PATENT DOCUMENTS

| | | | |
|---|---|---|---|
| 2015/0001500 A1* | 1/2015 | Sung | H10K 59/12 |
| | | | 257/40 |
| 2015/0280172 A1* | 10/2015 | Nishinohara | H10K 77/111 |
| | | | 257/40 |
| 2018/0337116 A1* | 11/2018 | Lin | H01L 23/3114 |
| 2020/0395419 A1 | 12/2020 | Kim et al. | |
| 2021/0151513 A1* | 5/2021 | Lee | G06F 3/0443 |
| 2021/0257434 A1* | 8/2021 | Xie | H10K 77/111 |

FOREIGN PATENT DOCUMENTS

| | | |
|---|---|---|
| KR | 101853032 B1 | 6/2018 |
| KR | 102059321 B1 | 12/2019 |
| KR | 1020200143565 A | 12/2020 |

\* cited by examiner

DISPLAY PANEL HAVING INCLINED EDGE DEFINED BY RESPECTIVE END SURFACES OF BASE SUBSTRATE AND INSULATING LAYER, AND DISPLAY DEVICE INCLUDING THE SAME

This application claims priority to Korean Patent Application No. 10-2020-0040717, filed on Apr. 3, 2020, and all the benefits accruing therefrom under 35 U.S.C. § 119, the entire contents of which are hereby incorporated by reference.

BACKGROUND

(1) Field

The disclosure relates to a display panel and a display device including the same. In particular, the disclosure relates to a display panel which reduces or effectively prevents a pixel failure, and a display device including the same.

(2) Description of the Related Art

Various display devices are being developed for use in multimedia devices, such as televisions, mobile phones, tablet computers, navigation systems and gaming machines.

The display device includes a display panel which displays an image. The display panel includes a plurality of gate lines, a plurality of data lines, and a plurality of pixels connected to the gate and data lines. The display panel is connected to an electronic component which is external to the display panel and provides electrical signals which are used to display an image, to the gate or data lines. The electronic component is mounted on the display panel using an anisotropic conductive film or an ultrasonography method.

SUMMARY

An embodiment provides a display panel which improves reliability in electrical connection between an electronic component (e.g., a circuit board) which provides electrical signals from outside the display panel to the display panel, and the display panel, and a display device including the same.

According to an embodiment, a display panel includes a base substrate including: a display region including a pixel, and a pad region defining an end surface of the base substrate which is furthest from the display region and exposed outside the display panel; an insulating layer in the display region and the pad region; and in the pad region: a signal pad electrically connected to the pixel and to a dummy pad; the insulating layer covering the signal pad and the dummy pad and defining an end surface of the insulating layer which is furthest from the display region and exposed outside the display panel; and a first opening in the insulating layer which exposes the signal pad outside the insulating layer and outside the display panel. In the pad region, the end surfaces of the base substrate and the insulating layer together define an inclined edge of the display panel.

In an embodiment, in a thickness direction of the base substrate, the insulating layer includes: a lower insulating layer between the base substrate and the dummy pad, an intermediate insulating layer between the lower insulating layer and the signal pad, and an upper insulating layer facing the intermediate insulating layer with the signal pad therebetween, and the lower insulating layer, the intermediate insulating layer, and the upper insulating layer respectively define end surfaces which together define the end surface of the insulating layer.

In an embodiment, the signal pad may include a first signal pad and a second signal pad which are arranged in a first direction. The dummy pad may include a first dummy pad corresponding to the first signal pad and a second dummy pad corresponding to the second signal pad.

In an embodiment, the intermediate insulating layer may include a first insulating layer and a second insulating layer which is on the first insulating layer, and the signal pad may be on the second insulating layer.

In an embodiment, the first dummy pad and the second dummy pad may be on the lower insulating layer and may be electrically connected to the first signal pad and the second signal pad, respectively.

In an embodiment, the display panel may further include a first connection pad and a second connection pad which are on the first insulating layer. The first connection pad may connect the first signal pad to the first dummy pad, and the second connection pad may connect the second signal pad to the second dummy pad.

In an embodiment, a second opening may be defined in the upper insulating layer, and the second opening may be between the first dummy pad and the second dummy pad, in the first direction. The display panel may further include a dummy insulating pattern in the second opening.

In an embodiment, the dummy insulating pattern may protrude from the upper insulating layer.

In an embodiment, the upper insulating layer may be between the first signal pad and the second signal pad, in the first direction.

In an embodiment, the first dummy pad, the second dummy pad and the dummy insulating pattern may be extended in a diagonal direction crossing the first direction. A length of each of the first dummy pad and the second dummy pad in the diagonal direction may be greater than a length of the dummy insulating pattern.

In an embodiment, the dummy pad may define an end surface thereof which is exposed outside the display panel, and in the pad region, the end surface of the base substrate, the end surface of the insulating layer and the end surface of the dummy pad together define the inclined edge of the display panel.

In an embodiment, in a thickness direction of the base substrate, a height difference between a top surface of the dummy insulating pattern and a top surface of the upper insulating layer may range from about 0.1 micrometer (μm) to about 0.5 μm.

In an embodiment, the pad region may include a first region in which the signal pad is disposed, and a second region which is adjacent to the first region in the first direction. The first opening may be defined in the first region, and the second opening may be defined in the second region.

In an embodiment, a width of a top surface of the signal pad, which is exposed by the first opening and is measured in the first direction, may be larger than a width of a top surface of the dummy insulating pattern, measured in the first direction.

In an embodiment, the signal pad may be extended in a diagonal direction crossing the first direction. A portion of the upper insulating layer in the pad region may be overlapped with the dummy pad.

According to an embodiment, a display device may include a display panel including a display region including a pixel, and a pad region which is adjacent to the display region and defines an inclined edge of the display panel which is furthest from the display region and exposed outside the display panel; an electronic component connected to the display panel at the pad region thereof; and a conductive adhesion film which electrically connects the electronic component to the display panel at the pad region thereof. The display panel includes: a base substrate defining an end surface of the base substrate which is furthest from the display region and exposed outside the display panel; an insulating layer in the display region and the pad region; and in the pad region: a signal pad electrically connected to the pixel; a dummy pad electrically connected to the signal pad; the insulating layer which covers the signal pad and the dummy pad and defines an end surface of the insulating layer which is furthest from the display region and exposed outside the display panel, and a first opening in the insulating layer which exposes the signal pad to outside the insulating layer and to outside the display panel. In the pad region, the end surface of the base substrate and the end surface of the insulating layer together define the inclined edge of the display panel.

In an embodiment, the pad region may include a first region in which the signal pad is disposed, and a second region which is adjacent to the first region in a first direction. The electronic component includes: a plurality of protruding portions in direct contact with the pad region of the display panel, and a plurality of gap portions respectively between the plurality of protruding portions. The plurality of protruding portions may be overlapped with the first region, and the plurality of gap portions may be overlapped with the second region.

In an embodiment, the plurality of protruding portions may be in contact with the signal pad.

In an embodiment, the signal pad may include a first signal pad and a second signal pad arranged in a first direction. The dummy pad may include a first dummy pad corresponding to the first signal pad and a second dummy pad corresponding to the second signal pad.

In an embodiment, a second opening may be defined in the upper insulating layer, and the second opening may be between the first dummy pad and the second dummy pad, in the first direction. The display device may further include a dummy insulating pattern in the second opening.

BRIEF DESCRIPTION OF THE DRAWINGS

Embodiments will be more clearly understood from the following brief description taken in conjunction with the accompanying drawings. The accompanying drawings represent non-limiting, embodiments as described herein.

Figure 1:
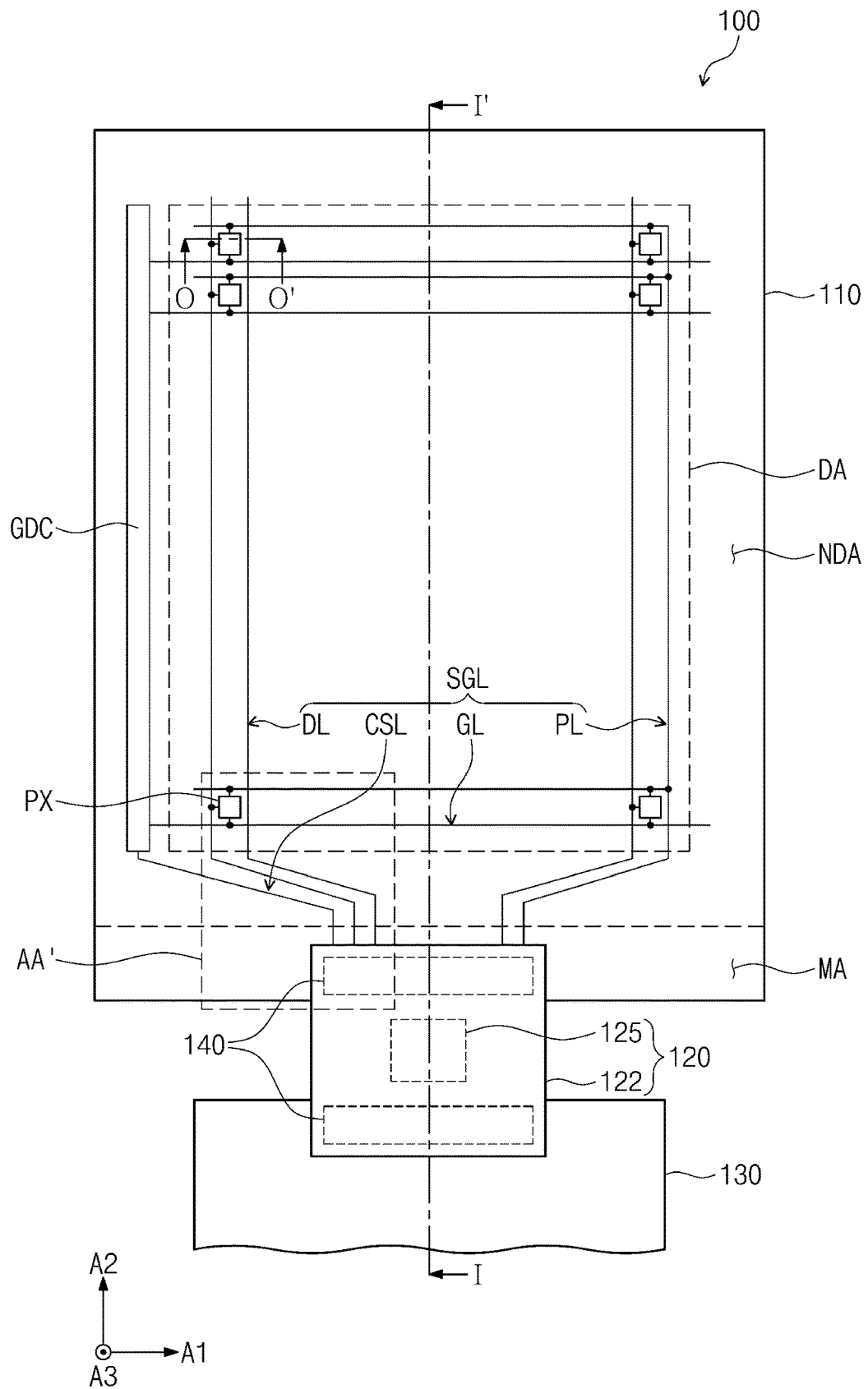
FIG. 1 is a plan view illustrating an embodiment of a display device.

It should be noted that these figures are intended to illustrate the general characteristics of methods, structure and/or materials utilized in embodiments and to supplement the written description provided below. These drawings are not, however, to scale and may not precisely reflect the precise structural or performance characteristics of any given embodiment, and should not be interpreted as defining or limiting the range of values or properties encompassed by embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments will now be described more fully with reference to the accompanying drawings, in which embodiments are shown. Embodiments may, however, be embodied in many different forms and should not be construed as being limited to the embodiments set forth herein; rather, these embodiments are provided so that this disclosure will be thorough and complete, and will fully convey the embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being related to another element such as being "connected" or "coupled" to another element, it can be directly connected or coupled to the other element or intervening elements may be present. In contrast, when an element is referred to as being related to another element such as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing embodiments only and is not intended to be limiting of embodiments. As used herein, the singular forms "a," "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein the term "and/or" includes any and all combinations of one or more of the associated listed items. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Embodiments are described herein with reference to cross-sectional illustrations that are schematic illustrations of idealized embodiments (and intermediate structures) of embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
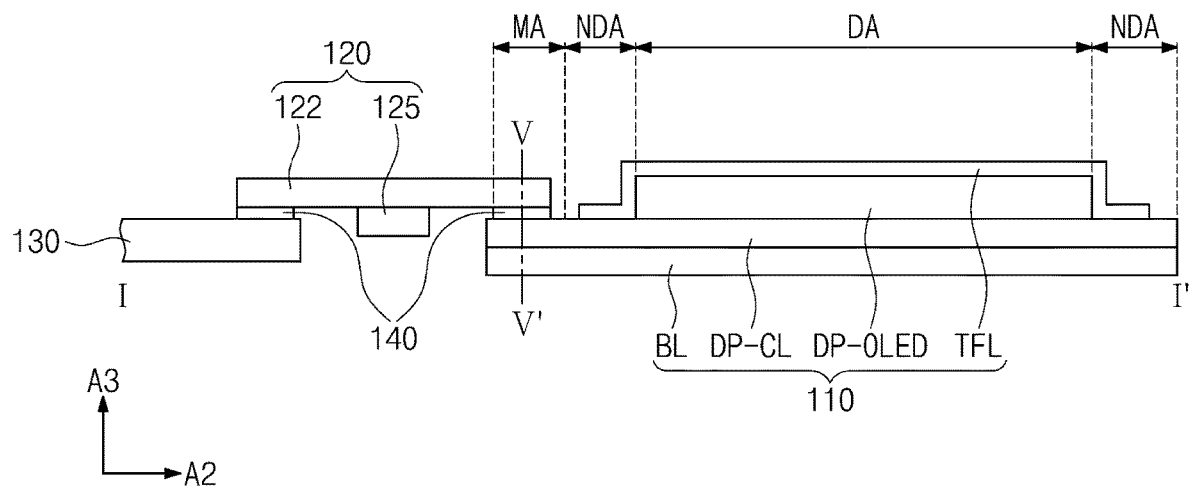
FIG. 2A is a cross-sectional view illustrating an embodiment of a display device.

FIG. 1 is a plan view illustrating an embodiment of a display device 100. FIG. 2A is a cross-sectional view illustrating an embodiment of a display device 100. FIG. 2A is a cross-sectional view taken along line I-I' of FIG. 1.

Referring to FIGS. 1 and 2A, a display device 100 may include a display panel 110, an electronic component 120 and a conductive adhesion film 140 (e.g., conductive adhesive layer or conductive adhesive pattern). The display device 100 may include a main circuit board 130, which is electrically connected to the electronic component 120 through the conductive adhesion film 140. In an embodiment, the electronic component 120 may include one or more of a flexible circuit board 122 (e.g., circuit board) and a data driving circuit 125 (e.g., driving chip).

The display panel 110 may include a display region DA provided with a pixel PX, and a non-display region NDA which is adjacent to the display region DA. The pixel PX may be provided in plural in the display region DA, including a plurality of pixels PX. A pad region PA, in which a pad electrode to be described below is disposed, may be defined in the non-display region NDA. In an embodiment, the display panel 110 may include a mounting region MA in which the electronic component 120 is disposed. The electronic component 120 may be coupled to the display panel 110 at the mounting region MA thereof, by the conductive adhesion film 140.

In an embodiment, the non-display region NDA and the mounting region MA may not be differentiated from each other. The mounting region MA may be a portion of the non-display region NDA. The pad region PA may be defined as a portion of the mounting region MA. That is, the non-display region NDA may include both of the mounting region MA and the pad region PA. The pad region PA will be described in more detail below. One or more of various components of the display device 100 may include a display region DA, a non-display region NDA, a mounting region MA and/or a pad region PA corresponding to those described above.

Referring to FIG. 1, the display panel 110 may generate and/or display an image by applying driving signals (e.g., electrical signals) to a plurality of pixels PX. The pixels PX may be arranged along a first direction A1 and a second direction A2 which crosses the first direction A1. The pixels PX may be arranged in a matrix shape within the display region DA, but are not limited thereto. The first direction A1 and the second direction A2 may be perpendicular to each other, but are not limited thereto. In an embodiment, the pixels PX may include a first pixel, a second pixel and a third pixel, which respectively display red, green, and blue colors, respectively. In an embodiment, the pixels PX may further include a pixel PX which displays at least one of white, cyan and magenta colors.

Each of the pixels PX may include a display element or light-emitting element such as an organic light emitting diode, and a driving circuit GDC which is connected thereto. The driving circuit GDC and signal lines SGL may be included in a circuit device layer DP-CL shown in FIG. 2A.

The driving circuit GDC may include a scan driving circuit. The scan driving circuit may generate a plurality of scan signals as electrical signals, and may sequentially output the scan signals to a scan line GL provided in plural including a plurality of scan lines GL to be described below. In addition, the scan driving circuit may output other electrical signals as control signals to a pixel driving circuit of the pixel PX.

The scan driving circuit may include a plurality of thin-film transistors of which portions or layers thereof are provided or formed by a same method as that for portions or layers of the pixel driving circuit of the pixels PX. In an embodiment, portions or layers of the plurality of thin-film transistors and/or the pixel driving circuit may be provided by a low-temperature polycrystalline silicon ("LTPS") or a low-temperature polycrystalline oxide ("LTPO") process.

The signal lines SGL may include a scan line GL provided in plural including scan lines GL, a data line DL provided in plural including data lines DL, a power line PL, and a control signal line CSL. Each of the scan lines GL may be connected to corresponding ones of the pixels PX, and each of the data lines DL may be connected to corresponding ones of the pixels PX. The power line PL may be connected to the pixels PX, such as each of the pixels PX without being limited thereto. The control signal line CSL may provide control signals to the scan driving circuit.

The signal lines SGL may be overlapped with or correspond to both of the display region DA and the non-display region NDA. Each of the signal lines SGL may include a pad portion and a line portion. The line portion may be overlapped with the display region DA and the non-display region NDA. Within one of the signal lines SGL, the pad portion may be connected to an end portion of the line portion. The pad portion of the signal lines SGL may be disposed in the non-display region NDA and may be overlapped with a corresponding one of a signal pad SD among a plurality of signal pads. A region of the non-display region NDA, in which the signal pads are disposed, may be defined as the pad region PA. This will be in more detail described below.

Based on a structure of the pixels PX, the display panel 110 may be classified into a liquid crystal display panel, an organic field emission display panel, an electrowetting display panel, or the like. In the embodiment, the display panel 110 may be an organic field emission display panel.

As shown in FIG. 2A, the display panel 110 may include a base substrate BL, and the circuit device layer DP-CL, a display device layer DP-OLED, and an encapsulation layer TFL, which are disposed on the base substrate BL. The circuit device layer DP-CL, the display device layer DP-OLED and the encapsulation layer TFL may be disposed in order from the base substrate BL, without being limited thereto. As used herein, an expression "a region/portion corresponds to another region/portion" means that the regions/portion are overlapped with each other (e.g., along a third direction A3), but are not limited to having a same planar area and/or a same planar shape as each other.

The base substrate BL may include a synthetic resin material such as a synthetic resin film. The base substrate BL may include a glass substrate, a metal substrate, or a substrate including or made of an organic/inorganic composite material.

The circuit device layer DP-CL may include at least one insulating layer and a circuit device. The insulating layer may include at least one inorganic material layer and at least one organic material layer. The circuit device may include signal lines SGL, a pixel driving circuit, and so forth.

The display device layer DP-OLED may include light-emitting devices such as organic light emitting diodes serving as a light emission device. The display device layer DP-OLED may further include an organic material layer, such as a pixel definition layer.

The encapsulation layer TFL may include a plurality of thin films. Some of the thin films may be provided to improve optical efficiency, and others may be provided to protect the organic light emitting diodes.

As shown in FIG. 1, a black matrix (not shown) blocking light may be disposed in the non-display region NDA. The driving circuit GDC providing gate signals as electrical signals to the pixels PX may be provided in the non-display region NDA. In an embodiment, a data driving circuit 125 may be further provided in the non-display region NDA. A pad region PA, which is used to receive electrical signals from the electronic component 120, may be defined in the mounting region MA.

The electronic component 120 may include the flexible circuit board 122 and the data driving circuit 125, as shown in FIGS. 1 and 2A. The data driving circuit 125 may include a driving chip. The data driving circuit 125 may be electrically connected to interconnection lines (e.g., conductive lines) of the flexible circuit board 122.

Where the electronic component 120 includes the data driving circuit 125, a pad portion of the display panel 110 may include data pads which are electrically connected to the data lines DL, and control signal pads which are electrically connected to the control signal lines CSL. The data lines DL may be connected to the pixels PX, and the control signal lines CSL may be connected to the driving circuit GDC. In the embodiment, the electronic component 120 is illustrated to have a chip-on-film structure, but is not limited to this example.

The main circuit board 130 may provide image data, control signals, a power voltage, or the like to the display panel 110 and/or the data driving circuit 125. The main circuit board 130 may be an interconnection substrate, which has a larger planar area than the flexible circuit board 122, and may include at least one of active and passive devices. The main circuit board 130 may be a flexible or rigid interconnection substrate and may include a pad portion (not shown) at which the main circuit board 130 is connected to the flexible circuit board 122.

Figure 2B:
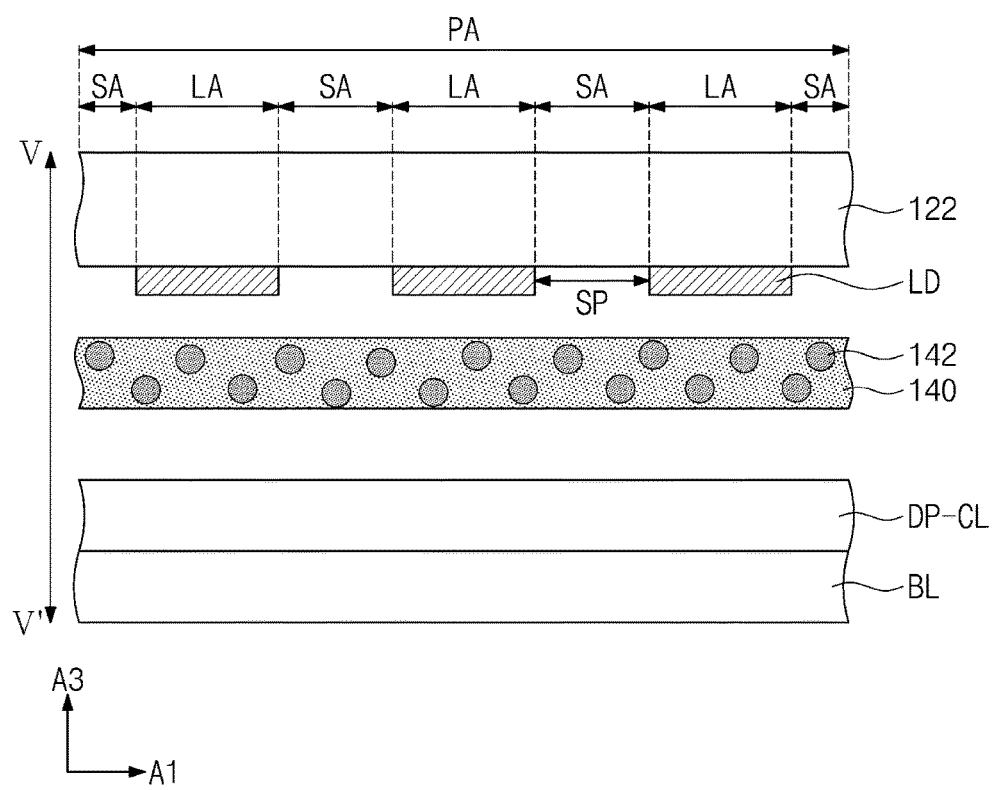
FIG. 2B is an enlarged cross-sectional view taken along line V-V' of FIG. 2A.

FIG. 2B is an enlarged cross-sectional view taken along line V-V' of FIG. 2A.

Referring to FIGS. 2A and 2B, the electronic component 120 may include a protruding portion LD provided in plural including a plurality of protruding portions LD, and a gap portion SP provided in plural between protruding portions LD which are adjacent to each other to include a plurality of gap portions SP. In an embodiment, the protruding portions LD and the gap portions SP may be extended from the flexible circuit board 122. A portion of the flexible circuit board 122 may be exposed to outside the protruding portions LD to define an exposed portion of the flexible circuit board 122.

The flexible circuit board 122 may correspond to the electronic component 120 disposed on and connected to the display panel 110. Taking FIGS. 2A and 2B together, the protruding portions LD may be in direct contact with the display panel 110 at a pad region PA of the display panel 110. As being in direct contact, elements may form an interface with each other, without being limited thereto. In detail, the protruding portions LD may be attached to the circuit device layer DP-CL of the display panel 110. The protruding portions LD may be in contact with a pad electrode of the circuit device layer DP-CL. The protruding portions LD may electrically connect the electronic component 120 to the display panel 110. That is, the display panel 110 may be electrically connected to the electronic component 120 at the protruding portions LD thereof. In an embodiment, the protruding portions LD may be conductive so as to electrically connect the electronic component 120 to the display panel 110.

The conductive adhesion film 140 may be disposed between the electronic component 120 and the display panel 110. In the pad region PA, the conductive adhesion film 140 may be disposed between the electronic component 120 and the circuit device layer DP-CL. The conductive adhesion film 140 may include a plurality of conductive members such as a plurality of conductive balls 142 electrically connecting the electronic component 120 to the display panel 110. The conductive balls 142 may be aligned to each other in a first direction A1, when the display panel 110 is electrically connected to the electronic component 120. The conductive adhesion film 140 may include a base layer (where "140" is indicated in FIG. 2B) together with the conductive balls 142 arranged within the base layer.

Figure 2C:
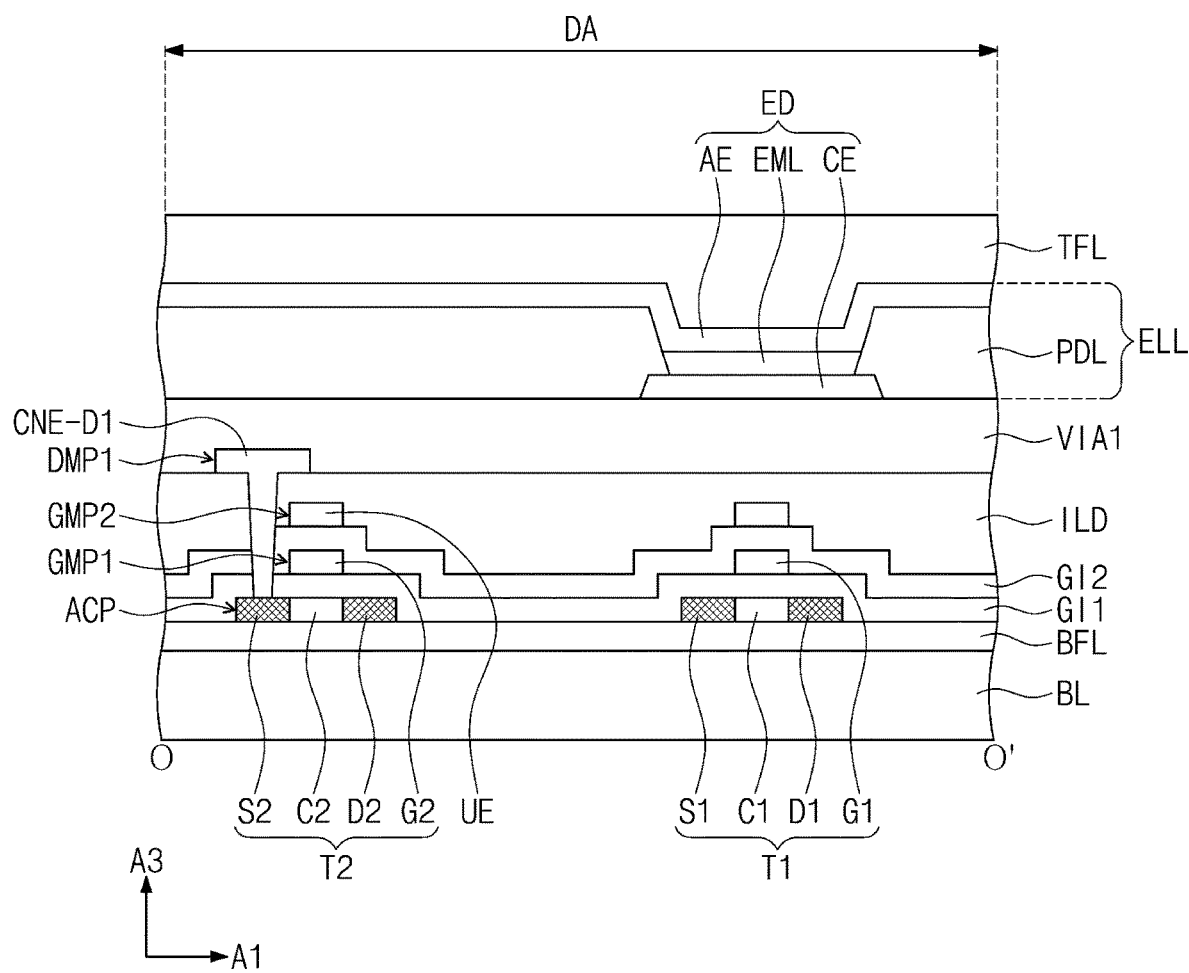
FIG. 2C is an enlarged cross-sectional view illustrating an embodiment of a display panel.

FIG. 2C is a cross-sectional view illustrating an embodiment of a display panel 110. FIG. 2C is a cross-sectional view taken along line 0-0' of FIG. 1.

FIG. 2C illustrates a cross-sectional view of the display region DA of the display panel 110. Referring to FIG. 2C, the display panel 110 may include a buffer layer BFL, a first gate insulating layer GIL a second gate insulating layer GI2, an interlayer insulating layer ILD, an upper insulating layer VIA1, a semiconductor layer including a semiconductor pattern ACP provided in plural including a plurality of semiconductor patterns ACP, a first conductive layer GMP1, a second conductive layer GMP2, and a third conductive layer DMP1. Here, the first conductive layer GMP1 may include a plurality of first gate metal patterns, the second conductive layer GMP2 may include a plurality of second gate metal patterns, and the third conductive layer DMP1 may include a plurality of first data metal patterns.

In an embodiment, each of the first gate insulating layer GIL the second gate insulating layer GI2 and the interlayer insulating layer ILD may include an organic material layer and/or an inorganic material layer. In an embodiment, each of the first gate insulating layer GIL the second gate insulating layer GI2 and a first insulating layer ILD1 may include a plurality of inorganic material layers. The inorganic material layers may include a silicon nitride layer and a silicon oxide layer. In an embodiment, each of the first and second conductive layers GMP1 and GMP2 may be formed of or include molybdenum (Mo), but are not limited thereto.

In an embodiment, the third conductive layer DMP1 may be formed of or include at least one of aluminum (A1) and titanium (Ti), but is not limited thereto. In an embodiment, the third conductive layer DMP1 may have a structure, in which titanium, aluminum and titanium layers are sequentially stacked.

The buffer layer BFL may be disposed on the base substrate BL. The buffer layer BFL may include a first buffer layer and a second buffer layer. The second buffer layer may face the base substrate BL with the first buffer layer therebetween. The buffer layer BFL may reduce or effectively prevent entry of a contamination material from the base substrate BL and into the pixel PX. In particular, the buffer layer BFL may reduce or effectively prevent diffusion of a contamination material into the semiconductor patterns ACP of a first transistor T1 and a second transistor T2 within the pixel PX.

The contamination material may be supplied from outside the display panel 110 or may be produced when the base substrate BL is thermally treated in a process of providing the display device 100. The contamination material may be a gaseous material or sodium, which is exhausted from the base substrate BL. In addition, the buffer layer BFL may reduce or effectively prevent entry of external moisture into the pixel PX.

The semiconductor pattern ACP may be disposed on the buffer layer BFL. In an embodiment, the semiconductor pattern ACP may face the base substrate BL with the buffer layer BFL therebetween.

The semiconductor layer including the semiconductor patterns ACP may provide respective portions of the first transistor T1 and the second transistor T2. The semiconductor pattern ACP may be formed of or include at least one of poly silicon, amorphous silicon and metal oxide semiconductor materials. In an embodiment, for example, as shown in FIG. 2C, the semiconductor patterns ACP may provide a first source region S1, a first active region C1 and a first drain region D1 of a first transistor T1 and as a second source region S2, a second active region C2 and a second drain region D2 of a second transistor T2.

The first gate insulating layer GI1 may be disposed on the buffer layer BFL to cover the semiconductor pattern ACP. The first conductive layer GMP1 may be disposed on the first gate insulating layer GI1. A first gate G1 of the first transistor T1 and a second gate G2 of the second transistor T2 are illustrated as respective portions of the first conductive layer GMP1. In an embodiment, although not shown, a respective portion of the first conductive layer GMP1 may include or provide one of two electrodes constituting a capacitor of the pixel PX.

The second gate insulating layer GI2 may be disposed on the first gate insulating layer GI1 to cover the first conductive layer GMP1. The second conductive layer GMP2 may be disposed on the second gate insulating layer GI2. In an embodiment, a respective portion of the second conductive layer GMP2 may include or provide the other of the two electrodes constituting the capacitor of the pixel PX. An upper electrode UE is illustrated as a respective portion of the second conductive layer GMP2.

The interlayer insulating layer ILD may be disposed on the second gate insulating layer GI2 to cover the second conductive layer GMP2. A first connection electrode CNE-D1 may be provided in plural on the interlayer insulating layer ILD to include first connection electrodes CNE-D1. First connection electrodes CNE-D1 of the third conductive layer DMP1 may be connected to the second source region S2 of the second transistor T2. The upper insulating layer VIA1 may be disposed on the interlayer insulating layer ILD to cover the third conductive layer DMP1.

Referring to FIG. 2C, in the display region DA, an emission device layer ELL may include an emission device ED (e.g., light emission device) and a planarization layer PDL. The emission device ED may include an anode electrode AE, an emission layer EML and a cathode electrode CE. Within the emission device ED, a first electrode may face a second electrode with the emission device layer ELL therebetween. The planarization layer PDL may correspond to a pixel definition layer.

An emission device layer ELL may be disposed on the upper insulating layer VIA1 The anode electrode AE may be electrically connected to the third conductive layer DMP1 through a contact hole defined in the planarization layer PDL. The planarization layer PDL may be disposed on the upper insulating layer VIA1 to expose at least a portion of the anode electrode AE to outside the planarization layer PDL. The emission layer EML may be disposed on the anode electrode AE. The cathode electrode CE may face the anode electrode AE with the emission layer EML therebetween.

Where the emission device ED is an organic light emitting diode ("OLED"), the emission layer EML may be formed of or include an organic material. Where the emission device ED is a micro light emitting diode ("LED"), the emission layer EML may be formed of or include an inorganic material. The encapsulation layer TFL may hermetically seal the emission device layer ELL and may protect the emission device layer ELL from external oxygen or moisture. The encapsulation layer TFL may include at least one of an organic material layer and an inorganic material layer.

Figure 3:
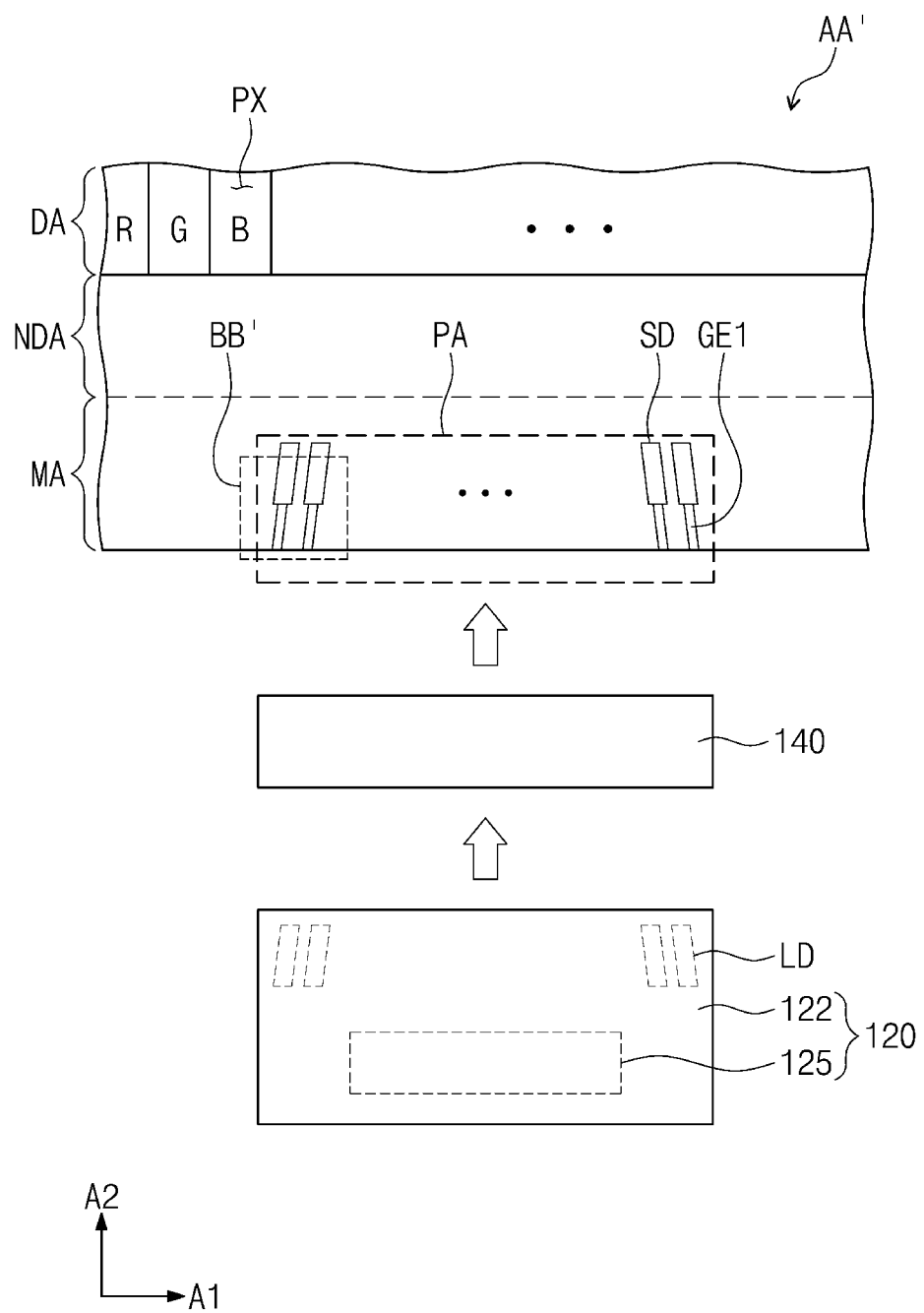
FIG. 3 is an enlarged top plan view illustrating portion AA' of FIG. 1.

FIG. 3 is an enlarged top plan view illustrating an embodiment of portion AA' of FIG. 1.

Referring to FIG. 3, the display panel 110 may include the pad region PA. The pad region PA may be defined in a portion of the mounting region MA. The display panel 110 may include a signal pad SD and a dummy pad GE1. The signal pad SD and the dummy pad GE1 may be disposed in the pad region PA. An electrical signal from outside the display panel 110 may be provided to the display panel 110 through the signal pad SD and/or the dummy pad GE1.

Referring to FIGS. 1 to 3, the flexible circuit board 122 of the electronic component 120 may be electrically connected to the display panel 110 at the pad region PA of the display panel 110, through the conductive adhesion film 140. In addition, a pad portion (not shown) of the main circuit board 130 may include pads corresponding to the protruding portions LD of the flexible circuit board 122. An input pad portion (not shown) of the flexible circuit board 122 and the pad portion (not shown) of the main circuit board 130 may also be connected to each other by the conductive adhesion film 140. The conductive adhesion film 140 may be an anisotropic conductive film ("ACF"). In an embodiment, the conductive adhesion film 140 may be replaced with solder bumps.

The protruding portions LD of the flexible circuit board 122 may be electrically connected to the display panel 110 at the pad region PA of the display panel 110, through the conductive adhesion film 140. The conductive adhesion film 140 may include the conductive balls 142. The conductive balls 142, which are aligned in the first direction A1, may electrically connect the protruding portions LD of the flexible circuit board 122 to the display panel 110, when the conductive adhesion film 140 between the flexible circuit board 122 and the display panel 110 is compressed.

The pad region PA of the display panel 110 has a flat structure. The pad region PA may be disposed parallel to a plane defined by the first direction A1 and the second direction A2 crossing each other. Therefore, the conductive balls 142 may be aligned and compressed evenly along the first direction A1 and/or the second direction A2 without bunching each other.

Referring again to FIG. 2B, the pad region PA may include a first region LA and a second region SA. The protruding portions LD may be overlapped with planar areas of the first region LA, and the gap portions SP may be overlapped with planar areas of the second region SA. The signal pad SD may be disposed in the pad region PA of the display panel 110. In an embodiment, a plurality of the signal pads may be provided. The first region LA may be a planar area at which the display panel 110 and the electronic component 120 are electrically connected to each other.

Referring to FIG. 3, the display panel 110 may include the signal pad SD and the dummy pad GE1, which are provided in the pad region PA. The signal pad SD may be electrically connected to the electronic component 120 through the conductive adhesion film 140. The dummy pad GE1 may be connected to the signal pad SD through a contact hole and may be extended to an edge EZ of the display panel 110 (e.g., see FIG. 5A).

The edge EZ of the display panel 110 may correspond to the outermost region of the mounting region MA of the display panel 110 along the second direction A2. The edge EZ may extend along the first direction A1. The outermost region may be furthest from the display region DA along the second direction A2. Ends or end surfaces of various layers within the display panel 110 may define respective portions of the edge EZ. The edge EZ may be a collection of the ends or end surfaces. The ends or end surfaces of the various layers may be exposed to outside the display panel 110 at the edge EZ thereof. In an embodiment, a monitoring device, which is used to monitor an operational state of the signal pad SD, may be coupled to the dummy pad GE1.

In an embodiment, the conductive adhesion film 140 may be fully overlapped with the pad region PA. A plurality of the conductive balls 142 may be pressed against not only the signal pad SD but also at regions corresponding to the dummy pad GE1 within the pad region PA. According to an embodiment, the display panel 110 may be provided to have a cross-section which minimizes or effectively prevents lumping or gathering of the conductive balls 142, by pressing thereof against regions corresponding to the dummy pad GE1.

Figure 4:
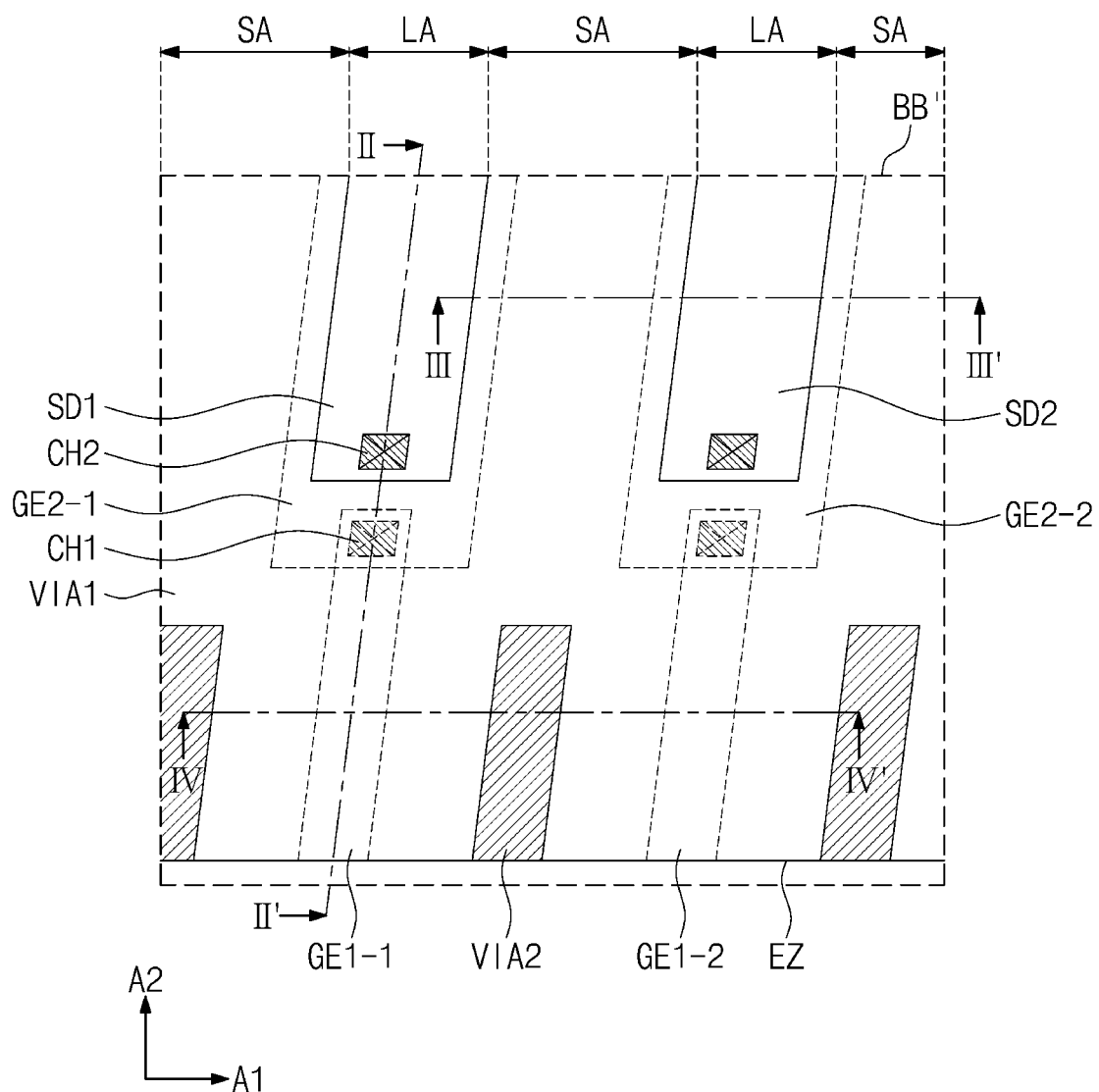
FIG. 4 is an enlarged top plan view illustrating an embodiment of a pad region of a display panel.

FIG. 4 is an enlarged top plan view illustrating an embodiment of the pad region PA of the display panel 110. FIG. 4 is an enlarged top plan view illustrating portion BB' of FIG. 3. FIG. 4 schematically illustrates a planar structure of the signal pad SD, which is disposed in a portion of the pad region PA. A stacking structure in a cross-sectional view will be described in more detail with reference to FIGS. 5A to 5C.

Referring to FIG. 4, the first region LA may include a planar area defined by dimensions along the first direction A1 and the second direction A2. The signal pad SD and the dummy pad GE1 which are electrically connected to each other, may be disposed in the pad region PA of the display panel 110. The signal pad SD and the dummy pad GE1 may be disposed in the first region LA. The dummy pad GE1 may be connected to the signal pad SD through a contact hole and may be disposed to be further from the display region DA than the signal pad SD, along the second direction A2, in the first region LA. The dummy pad GE1 may be connected to the signal pad SD by a connection pad GE2. The connection pad GE2 may be disposed between the signal pad SD and the dummy pad GE1, along a thickness direction of the signal pad SD (e.g., along the third direction A3). In more detail, the dummy pad GE1 may be electrically connected to the connection pad GE2 through a first contact hole CH1. The connection pad GE2 may be electrically connected to the signal pad SD through a second contact hole CH2.

The signal pads may include a first signal pad SD1 and a second signal pad SD2, which are arranged spaced apart from each other along the first direction A1, that is, along a length direction of the edge EZ. A length of the first signal pad SD1 and the second signal pad SD2 may be extended in a diagonal direction (e.g., inclined direction) which crosses the first direction A1. An angle between the diagonal direction and the second direction A2 may be smaller than an angle between the diagonal direction and the first direction A1.

Figure 5A:
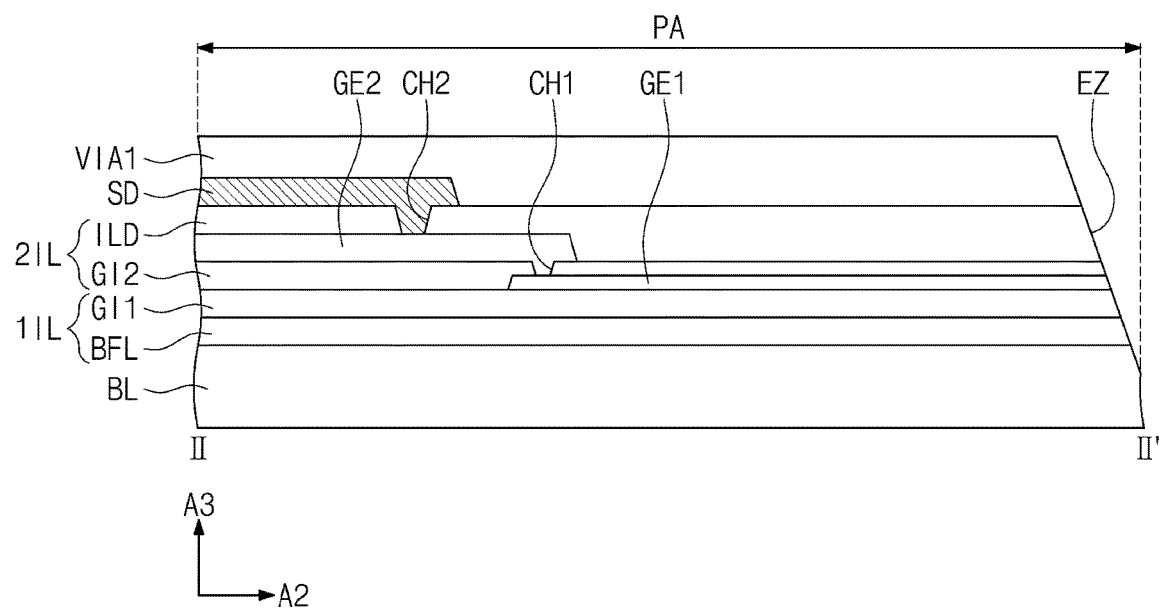
FIGS. 5A to 5C are enlarged cross-sectional views illustrating embodiments of a pad region of a display panel.
Figure 5B:
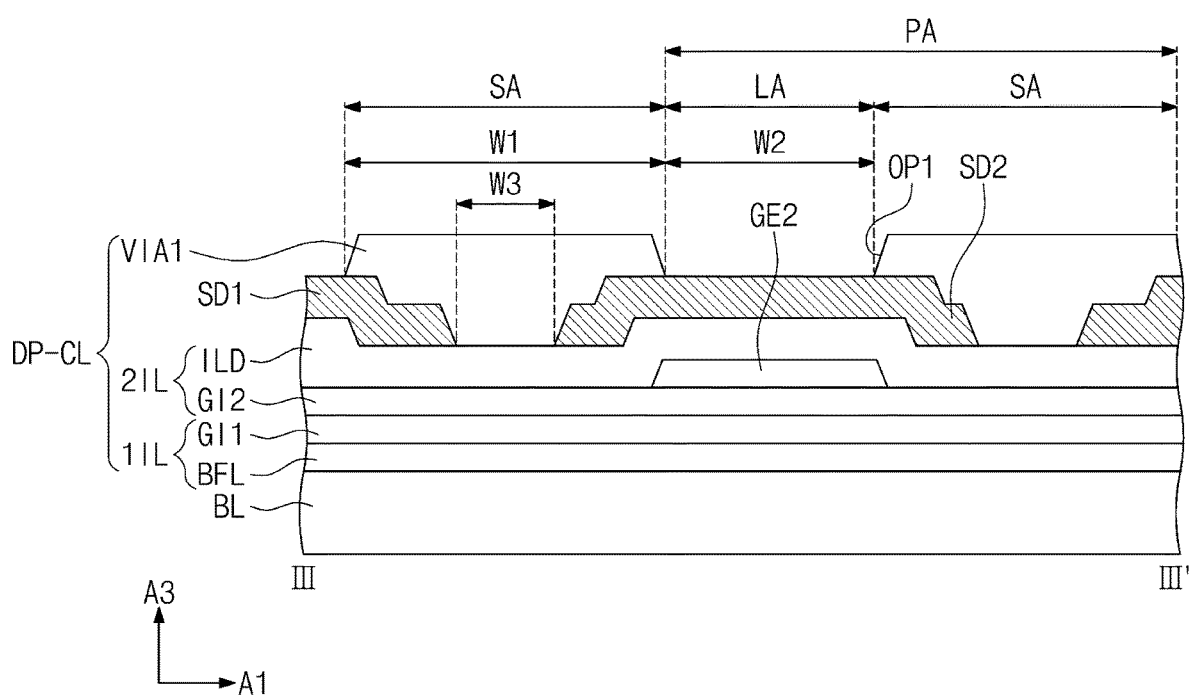

A plurality of dummy pads may include a first dummy pad GE1-1 corresponding to the first signal pad SD1 and a second dummy pad GE1-2 corresponding to the second signal pad SD2. The second dummy pad GE1-2 is spaced apart from the first dummy pad GE1-1 in the first direction A1. The first dummy pad GE1-1 may be connected to an end portion of the first signal pad SD1 which is closest to the edge EZ along the second direction A2, and the second dummy pad GE1-2 may be connected to an end portion of the second signal pad SD2 which is closest to the edge EZ along the second direction A2. A plurality of connection pads may include a first connection pad GE2-1 and a second connection pad GE2-2. The first connection pad GE2-1 may electrically connect the first signal pad SD1 to the first dummy pad GE1-1, and the second connection pad GE2-2 may electrically connect the second signal pad SD2 to the second dummy pad GE1-2. Referring to FIGS. 5A and 5B, for example, along the thickness direction of the base substrate BL, the first connection pad GE2-1 and the second connection pad GE2-2 are each between the first insulating layer and the second insulating layer of the intermediate insulating layer 2IL.

Referring to FIG. 4, the display panel 110 may include the upper insulating layer VIA1 and a dummy insulating pattern VIA2, which are provided in the pad region PA. A portion of the upper insulating layer VIA1 in the second region SA may be disposed between the first signal pad SD1 and the second signal pad SD2, and a portion of the upper insulating layer VIA1 in the first region LA may be overlapped with the first dummy pad GE1-1 and the second dummy pad GE1-2 and may be disposed between the dummy insulating patterns VIA2. The dummy insulating pattern VIA2 may be overlapped with the second region SA. The dummy insulating pattern VIA2 may be disposed between the first dummy pad GE1-1 and the second dummy pad GE1-2.

In an embodiment, the first dummy pad GE1-1, the second dummy pad GE1-2 and/or the dummy insulating pattern VIA2 may be lengthwise extended in a diagonal direction crossing the first direction A1. The diagonal direction may be a direction between the first direction A1 and the second direction A2. In an embodiment, lengths of the first dummy pad GE1-1 and the second dummy pad GE1-2 along the diagonal direction may be larger than a length of the dummy insulating pattern VIA2, taken along the diagonal direction.

The structure of FIG. 4 will be described with reference to FIG. 2C. The dummy pad GE1 may be referred to as a first gate electrode GE1. The first gate electrode GE1 in the pad region PA and the first conductive layer GMP1 in the display region DA of the display panel 110 may be respective portions of a same material layer on the base substrate BL. The first gate electrode GE1, the first gate G1 of the first transistor T1 and the second gate G2 of the second transistor T2 may be respective portions a same material layer on the base substrate BL.

The connection pad GE2 may be referred to as a second gate electrode GE2. The second gate electrode GE2 in the pad region PA and the second conductive layer GMP2 in the display region DA may be respective portions of a same material layer on the base substrate BL. The second gate electrode GE2 in the pad region PA and the upper electrode UE in the display region DA may be respective portions a same material layer on the base substrate BL.

The signal pad SD in the pad region PA and the first connection electrode CNE-D1 in the display region DA may be respective portions of a same material layer on the base substrate BL. The stacking structure in the pad region PA will be described with reference to FIGS. 5A to 5C.

Figure 5C:
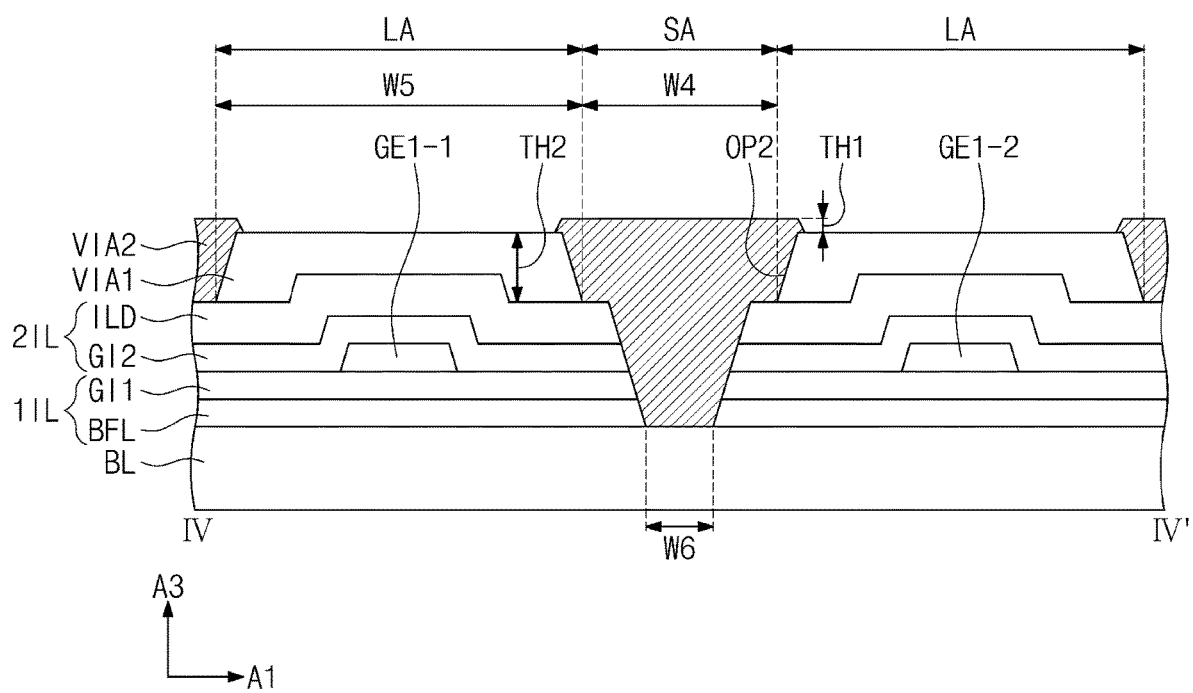

FIGS. 5A to 5C are enlarged cross-sectional views illustrating an embodiment of a pad region PA of a display panel 110.

FIG. 5A is an enlarged cross-sectional view taken along line II-IP of FIG. 4. FIG. 5A is a diagram illustrating a region, in which the edge EZ of the pad region PA is provided (e.g., an end portion or edge portion of the display panel 110).

Referring to FIG. 5A, in the pad region PA, the display panel 110 may include portions of the base substrate BL, the buffer layer BFL, the first gate insulating layer GI1, the second gate insulating layer GI2 and the upper insulating layer VIA1 In an embodiment, the display panel 110 may include the interlayer insulating layer ILD. The upper insulating layer VIA1 may include an organic material layer. In an embodiment, for example, the upper insulating layer VIA1 may be formed of or include polyimide ("PI").

Hereinafter, the structure including the buffer layer BFL and the first gate insulating layer GI1 may be referred to as a lower insulating layer 1IL. The structure including the second gate insulating layer GI2 and the interlayer insulating layer ILD may be referred to as an intermediate insulating layer 21L. In detail, the intermediate insulating layer 21L may include a first insulating layer and a second insulating layer which is disposed on the first insulating layer, and the first insulating layer and the second insulating layer may correspond to the second gate insulating layer GI2 and the interlayer insulating layer ILD, respectively. Along a thickness direction of the base substrate BL, the intermediate insulating layer 21L includes the first insulating layer and the second insulating layer in order from the lower insulating layer 1IL to the signal pad SD.

More than one among the lower insulating layer 1IL, the intermediate insulating layer 21L and the upper insulating layer VIA1 may be collectively referred to as an insulating layer. In the pad region PA, the insulating layer covers each of the signal pad SD and the dummy pad GE1. In an embodiment, the base substrate BL, one or more of the insulating layer and the dummy pad GE1 defines an end surface which is furthest from the display region DA and exposed to outside the display panel 110. The end surfaces together define the edge EZ (e.g., inclined edge) of the display panel 110.

The dummy pad GE1 may be disposed on the lower insulating layer 1IL. The dummy pad GE1 may face the base substrate BL with the lower insulating layer 1IL therebetween. The dummy pad GE1 may be extended to the edge EZ in the pad region PA and may have a side surface, which is positioned at the edge EZ and is exposed to outside the display panel 110 to define an exposed side surface of the dummy pad GE1. The edge EZ of the display panel 110 may have an inclined shape from the upper insulating layer VIA1 to the base substrate BL, relative to the plane defined by the first direction A1 and the second direction A2 crossing each other. In an embodiment, the display panel 110 may have a continuously inclined surface as the edge EZ, which is positioned in the pad region PA and is extended in the second direction A2 from an end surface of the upper insulating layer VIA1 to an end surface of the base substrate BL. The exposed side surface of the dummy pad GE1 may constitute a portion of the inclined surface. Here, the expression "continuously" may be used to represent that there is no stepwise structure between adjacent layers in a region from the upper insulating layer VIA1 to the base substrate BL. In other words, the continuously inclined surface may correspond to a linearly inclined surface where respective side surfaces of layers are coplanar with each other. Although the linearly inclined surface is illustrated, the inclined surface may be provided to have a curved shape. The display panel 110 may include the edge EZ defined by the inclined surface and the upper insulating layer VIA1 may be extended to the edge EZ.

The connection pad GE2 may be disposed in the intermediate insulating layer 21L. In detail, the connection pad GE2 may be disposed on the second gate insulating layer GI2. The first contact hole CH1 may be defined in the second gate insulating layer GI2.

The signal pad SD may be disposed on the intermediate insulating layer 21L and may be partially covered with the upper insulating layer VIA1 In detail, the signal pad SD may be disposed on the interlayer insulating layer ILD. The second contact hole CH2 may be defined in the interlayer insulating layer ILD.

FIG. 5B is an enlarged cross-sectional view taken along line of FIG. 4. FIG. 5B is an enlarged cross-sectional view of the display region DA illustrating the signal pad SD.

Referring to FIG. 5B, the pad region PA may be defined in the display panel 110 and may include the first region LA and the second region SA.

The display panel 110 may include the signal pad SD disposed on the interlayer insulating layer ILD. A portion of the signal pad SD may be exposed to outside the upper insulating layer VIA1 and thus may be electrically connected to the electronic component 120 through the conductive adhesion film 140. The signal pad SD may be overlapped with the first region LA. In an embodiment, a plurality of the signal pads may be provided. Portions of the upper insulating layer VIA1 may be disposed between the signal pads along the first direction A1. In an embodiment, a portion of the upper insulating layer VIA1 may be disposed between the first signal pad SD1 and the second signal pad SD2.

The upper insulating layer VIA1 may be disposed on the intermediate insulating layer 21L and may be overlapped with both the display region DA and the pad region PA. A first opening OP1 may be defined in the upper insulating layer VIA1 to expose the signal pad SD to outside the display panel 110. The first opening OP1 may be overlapped with the first region LA. In an embodiment, the first opening OP1 may be provided in plural including a plurality of the first openings OP1 respectively corresponding to the plurality of the signal pads. The upper insulating layer VIA1 may be divided into a plurality of upper insulating layer patterns by the plurality of first openings OP1. A portion of the upper insulating layer VIA1 may be overlapped with the second region SA. The portion of the upper insulating layer VIA1 which is overlapped with the second region SA may have a first width W1 ranging from about 12 micrometers (μm) to about 16 μm. The first width W1 may be a maximum dimension of the portion of the upper insulating layer VIA1 which is between signal pads adjacent to each other.

A second thickness TH2 (e.g., see FIG. 5C) of the upper insulating layer VIA1 at the first region LA may range from about 0.6 μm to about 1.0 μm. In an embodiment, the second thickness TH2 may be about 0.8 μm. As used herein, a thickness of an element may be a maximum dimension of the element along a direction parallel to the third direction A3, and may correspond to a thickness of the element measured in thickness direction of the base substrate BL.

Referring again to FIG. 5B, the upper insulating layer VIA1 may be overlapped with the second region SA. The upper insulating layer VIA1 may cover gap regions, which are positioned between signal pads adjacent to each other. Referring to FIG. 5A, the upper insulating layer VIA1 may cover an end portion of the signal pad SD. In an embodiment, a third distance W3 (e.g., third width) between the signal pads adjacent to each other may range from about 4 μm to about 5 μm. The third distance W3 may be a minimum distance between the signal pads adjacent to each other. A width portion of the signal pad SD which is exposed by the first opening OP1 may have a second width W2 ranging from about 9 μm to about 12 μm.

As shown in FIG. 5B, the connection pad GE2 may be overlapped with the first region LA and may be disposed on the second gate insulating layer GI2. A maximum width of the connection pad GE2 taken along the base substrate BL and along the first direction A1 may be larger than the second width W2 of the exposed portion of the signal pad SD. The maximum width of the connection pad GE2 may range from about 13 μm to about 15 μm.

FIG. 5C is an enlarged cross-sectional view taken along line IV-IV' of FIG. 4. FIG. 5C is a cross-sectional view of the pad region PA provided with the dummy pad GE1.

Referring to FIG. 5C, the display panel 110 may include a plurality of dummy pads. The dummy pads may include the first dummy pad GE1-1 and the second dummy pad GE1-2. The dummy pads may be overlapped with the upper insulating layer VIA1 and may be disposed in the first region LA. A second opening OP2 may be defined at a position between the first dummy pad GE1-1 and the second dummy pad GE1-2. The second opening OP2 may be overlapped with the second region SA. The second opening OP2 may be defined in the upper insulating layer VIA1, and extend through the lower insulating layer 1IL and the intermediate insulating layer 21L. That is, the second opening OP2 exposes at least the intermediate insulating layer 21L to outside the upper insulating layer VIA1 A fourth width W4 of the second opening OP2 defined in the upper insulating layer VIA1 may range from about 6 μm to about 10 μm. In an embodiment, the fourth width W4 of the second opening OP2 may be about 8 μm. The fourth width W4 may be a minimum dimension of the second opening OP2 at the upper insulating layer VIA1

Referring again to FIG. 5C, the upper insulating layer VIA1 may be disposed between the dummy insulating patterns VIA2 which are adjacent to each other and may be overlapped with the first region LA. Along the first direction A1, a fifth width W5 of the upper insulating layer VIA1 disposed between the dummy insulating patterns VIA2 may be larger than a width of the dummy insulating pattern VIA2 at a top surface thereof furthest from the base substrate BL. The fifth width W5 may be a maximum dimension along the first direction A1. In an embodiment, for example, along the first direction A1, the fifth width W5 of the upper insulating layer VIA1 in the first region LA between the dummy insulating patterns VIA2 which are adjacent to each other may range from about 16 μm to about 18 μm. The width of the dummy insulating pattern VIA2 along the first direction A1 may be about 8 μm.

In an embodiment, along the first direction A1, a width of the dummy insulating pattern VIA2 at the top surface thereof may be smaller than the second width W2 of the exposed top surface of the signal pad SD (e.g., see FIG. 2B). In an embodiment, for example, the second width W2 of the top surface of the signal pad SD (e.g., see FIG. 2B) along the first direction A1 may range from about 9 μm to about 12 μm, and the width of the dummy insulating pattern VIA2 at the top surface thereof, along the first direction A1 may be about 8 μm.

The second opening OP2 may expose the base substrate BL. A sixth width W6 of the exposed portion of the base substrate BL may range from about 3 μm to about 6 μm. The sixth width W6 may also represent a minimum dimension of the second opening OP2, taken along the first direction A1.

The various widths described above are illustrated relative to the first direction A1. In embodiments, the respective widths and the dimensions thereof may be further defined relative to the second direction A2, without being limited thereto.

The dummy insulating pattern VIA2 may be disposed in the second opening OP2.

In other words, the dummy insulating pattern VIA2 may cover the second opening OP2. The dummy insulating pattern VIA2 may extend from outside the upper insulating layer VIA1 and into the second opening OP2, to meet the base substrate BL, without being limited thereto. The dummy insulating pattern VIA2 may be disposed between portions of patterns of the upper insulating layer VIA1 The dummy insulating pattern VIA2 may be defined by a respective portion or pattern of an organic material layer including polyimide ("PI"). A portion of the dummy insulating pattern VIA2 may protrude along the third direction A3 from the top surface of the upper insulating layer VIA1 which is furthest from the base substrate BL. The protruded portion of the dummy insulating pattern VIA2 may define the top surface thereof. The dummy insulating pattern VIA2 which is in the second opening OP2 at a position between the first dummy pad GE1-1 and the second dummy pad GE1-2 protrudes outside of the upper insulating layer VIA'.

Along the thickness direction of the base substrate BL (e.g., along the third direction A3), a first thickness TH1 of the protruded portion of the dummy insulating pattern VIA2 is defined by a distance between the top surface of the dummy insulating pattern VIA2 and the top surface of the upper insulating layer VIA1 The first thickness TH1 may range from about 0.1 µm to about 0.5 µm. In an embodiment, the first thickness TH1 may be about 0.3 µm. That is, the first thickness TH1 is protruded outside the upper insulating layer VIA1.

In an embodiment, a maximum thickness of the dummy insulating pattern VIA2 along the third direction A3 may range from about 1.2 µm to about 2.0 µm, and may be about 1.6 µm. In an embodiment, for example, the maximum thickness of the dummy insulating pattern VIA2 may be about two times the maximum thickness of the upper insulating layer VIA1 The maximum thickness of the dummy insulating pattern VIA2 may correspond to a vertical length from the top surface of the dummy insulating pattern VIA2 to the base substrate BL.

In an embodiment, each of the upper insulating layer VIA1 and the dummy insulating pattern VIA2 may include a top surface furthest from the base substrate BL, at least a portion of the top surface being flat. In an embodiment, both of the upper insulating layer VIA1 and the dummy insulating pattern VIA2 may be provided to have flat top surfaces. The top surfaces of the upper insulating layer VIA1 and the dummy insulating pattern VIA2 may be parallel to each other, that is, disposed respective planes which are parallel to each other. The top surface of the dummy insulating pattern VIA2 is illustrated to be further from the base substrate BL than the top surface of the upper insulating layer VIA1 along the direction of the third direction A3, but is not limited thereto. In an embodiment, the top surface of the dummy insulating pattern VIA2 may be closer to the base substrate BL than the top surface of the upper insulating layer VIA1

Figure 6:
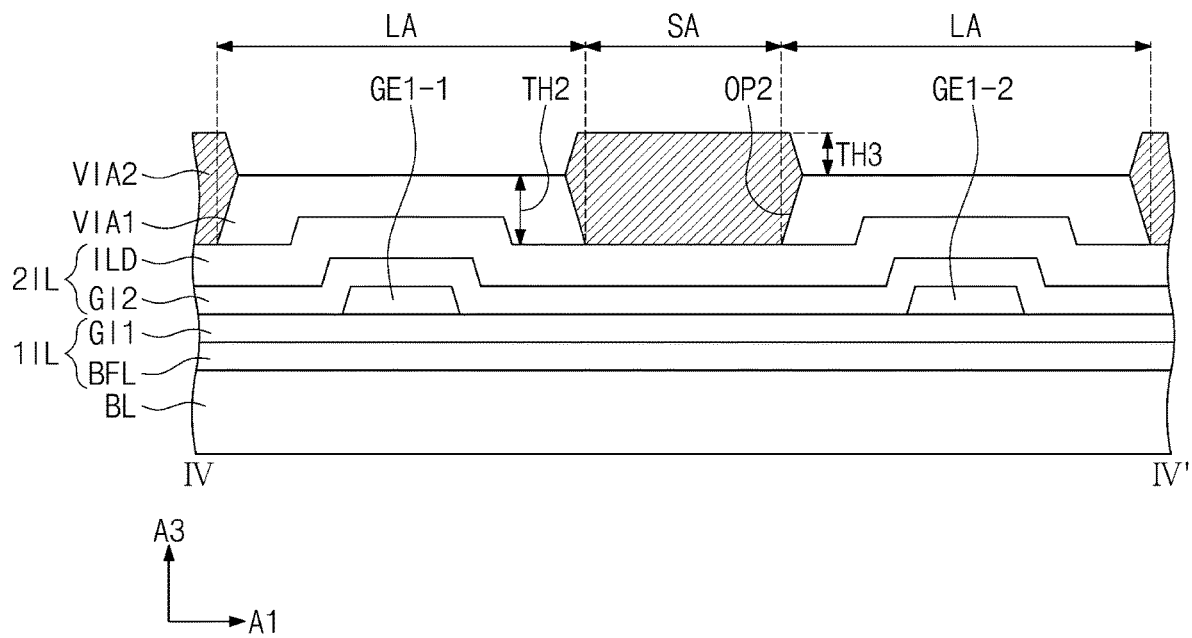
FIG. 6 is an enlarged cross-sectional view illustrating an embodiment of a pad region.

FIG. 6 is an enlarged cross-sectional view illustrating an embodiment of a pad region PA. FIG. 6 illustrates an embodiment of the pad region PA of the display panel 110 taken along line IV-IV' of FIG. 4.

Referring to FIG. 6, the dummy insulating pattern VIA2 may be disposed in the second region SA. The dummy insulating pattern VIA2 may protrude from a top surface of the upper insulating layer VIA1, in the direction away from the base substrate BL and along the third direction A3. In an embodiment, a length TH3 (e.g., third thickness) of the portion of the dummy insulating pattern VIA2 protruding from the top surface of the upper insulating layer VIA1 may be substantially equal to the second thickness TH2 of the upper insulating layer VIA1 In an embodiment, for example, both the second thickness TH2 and the length TH3 may be about 0.8 µm. The dummy insulating pattern VIA2 may cover openings defined in the upper insulating layer VIA'. In an embodiment, a maximum thickness of the dummy insulating pattern VIA2 covering the openings may be about two times the maximum thickness of the upper insulating layer VIA1.

The dummy insulating pattern VIA2 may extend only through the upper insulating layer VIA1 Referring to FIG. 6, the dummy insulating pattern VIA2 may face the base substrate BL with each of the intermediate insulating layer 2IL and the lower insulating layer 1IL therebetween.

Figure 7:
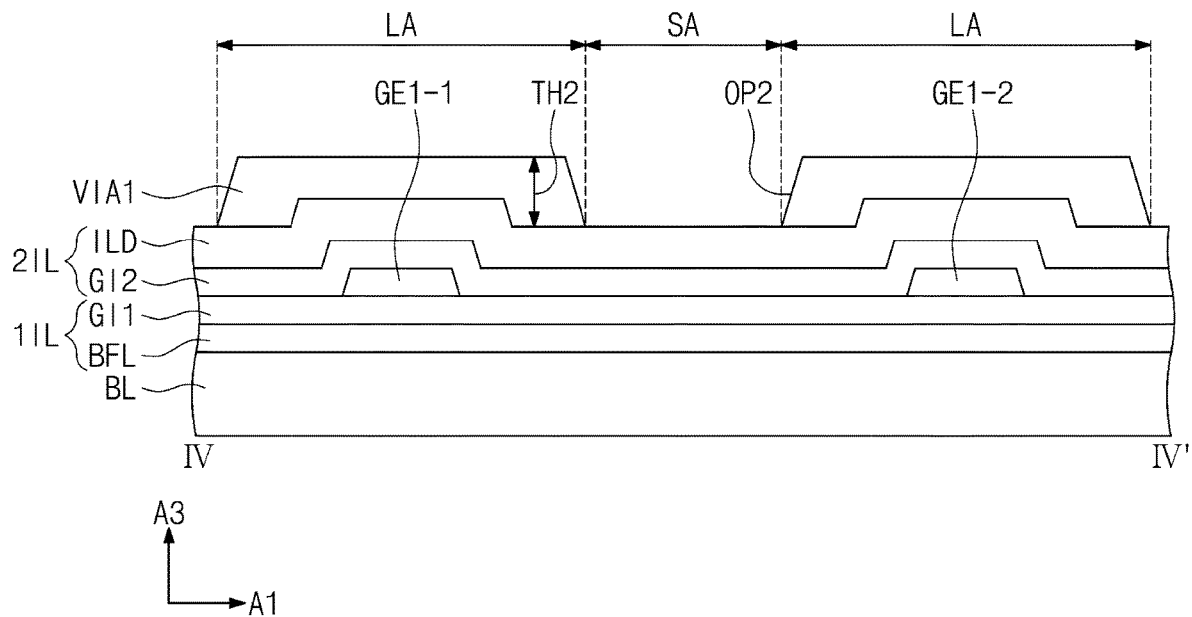
FIG. 7 is an enlarged cross-sectional view illustrating an embodiment of a pad region.

FIG. 7 is an enlarged cross-sectional view illustrating an embodiment of a pad region PA.

In an embodiment, the display panel 110 may exclude the dummy insulating pattern VIA2 in the pad region PA at the second region SA thereof. The upper insulating layer VIA1 may have openings overlapped with the second region SA. The openings may expose the interlayer insulating layer ILD and/or the intermediate insulating layer 2IL to outside the upper insulating layer VIA1.

According to one or more embodiment, a stepwise structure at edge portions of signal pads connected to pixels PX through signal lines SGL, is omitted, which thereby reduces or effectively prevents a pixel failure issue.

According to one or more embodiment, an upper insulating layer VIA1 on the signal pad SD may be extended to an edge portion of a display panel 110, in which a dummy pad GE1 is disposed, and a dummy insulating pattern VIA2 may be disposed between patterns of the extended portion of the upper insulating layer VIA1. Accordingly, a height difference between layers and consequential technical issues (e.g., lumping issues of conductive balls 142 in contact with the dummy pad GE1 and a resultant short circuit issue) may be reduced or effectively prevented. That is, the upper insulating layer VIA1 and the dummy insulating pattern VIA2 may effectively planarize a stepwise structure defined by underlying layers, to minimize the height difference.

While embodiments have been shown and described, it will be understood by one of ordinary skill in the art that variations in form and detail may be made therein without departing from the spirit and scope of the attached claims.

What is claimed is:

1. A display panel, comprising:
  a base substrate including:
    a display region including a pixel, and
    a pad region which is adjacent to the display region and defines an end surface of the base substrate which is furthest from the display region and exposed outside the display panel;
  an insulating layer which is in the display region and the pad region; and
  in the pad region:
    a signal pad electrically connected to the pixel;
    a dummy pad electrically connected to the signal pad;
    the insulating layer which covers the signal pad and the dummy pad and defines an end surface of the insulating layer which is furthest from the display region and exposed outside the display panel; and
    a first opening in the insulating layer which exposes the signal pad to outside the insulating layer and to outside the display panel,
    wherein, in the pad region, the end surface of the base substrate and the end surface of the insulating layer together define an inclined edge of the display panel.

2. The display panel of claim 1, wherein
  in a thickness direction of the base substrate, the insulating layer comprises:
    a lower insulating layer between the base substrate and the dummy pad,
    an intermediate insulating layer between the lower insulating layer and the signal pad, and
    an upper insulating layer facing the intermediate insulating layer with the signal pad therebetween, and
  the lower insulating layer, the intermediate insulating layer, and the upper insulating layer respectively define end surfaces which together define the end surface of the insulating layer.

3. The display panel of claim 2, wherein the inclined edge of the display panel extends along a first direction,
  further comprising:
    the signal pad provided in plural, and the plurality of the signal pads comprising a first signal pad and a second signal pad which are arranged spaced apart from each other in the first direction, and the dummy pad provided in plural, and the plurality of the dummy pads comprising:
a first dummy pad corresponding to the first signal pad, and
a second dummy pad corresponding to the second signal pad and spaced apart from the first dummy pad in the first direction.

4. The display panel of claim 3, wherein along the thickness direction of the base substrate, the intermediate insulating layer comprises a first insulating layer and a second insulating layer in order from the lower insulating layer to each of the first signal pad and the second signal pad.

5. The display panel of claim 3, wherein
along the thickness direction of the base substrate, the first dummy pad and the second dummy pad are each between the lower insulating layer and the upper insulating layer, and
the first dummy pad and the second dummy pad are electrically connected to the first signal pad and the second signal pad, respectively.

6. The display panel of claim 4, further comprising:
a first connection pad which connects the first signal pad to the first dummy pad, and
a second connection pad which connects the second signal pad to the second dummy pad,
wherein along the thickness direction of the base substrate, the first connection pad and the second connection pad are each between the first insulating layer and the second insulating layer of the intermediate insulating layer.

7. The display panel of claim 3, further comprising:
a second opening defined in the upper insulating layer at a position between the first dummy pad and the second dummy pad, wherein the second opening exposes the intermediate insulating layer to outside the upper insulating layer, and
a dummy insulating pattern in the second opening.

8. The display panel of claim 7, wherein the dummy insulating pattern which is in the second opening at the position between the first dummy pad and the second dummy pad protrudes outside of the upper insulating layer.

9. The display panel of claim 3, wherein
the first opening is defined in the upper insulating layer, and
the upper insulating layer extends between the first signal pad and the second signal pad, in the first direction.

10. The display panel of claim 7, wherein
a diagonal direction crosses the first direction,
each of the first dummy pad, the second dummy pad and the dummy insulating pattern has a length along the diagonal direction, and
the length of the first dummy pad and the length of the second dummy pad are each greater than the length of the dummy insulating pattern.

11. The display panel of claim 1, wherein
the dummy pad defines an end surface thereof which is exposed outside the display panel, and
in the pad region, the end surface of the base substrate, the end surface of the insulating layer and the end surface of the dummy pad together define the inclined edge of the display panel.

12. The display panel of claim 8, wherein along the thickness direction of the base substrate,
the dummy insulating pattern has a thickness which is outside of the upper insulating layer, and the thickness the dummy insulating pattern ranges from about 0.1 micrometer to about 0.5 micrometer.

13. The display panel of claim 7, wherein
the pad region comprises:
a first region corresponding to the first signal pad and the second signal pad, and
a second region which is between the first signal pad and the second signal pad and adjacent to the first region in the first direction,
the first opening which exposes the signal pad is defined in the first region, and
the second opening which exposes the intermediate insulating layer to outside the upper insulating layer is defined in the second region.

14. The display panel of claim 7, wherein
the first opening is provided in plural,
each of the first signal pad and the second signal pad has a width which is exposed by the respective first openings and the width is measured in the first direction,
the dummy insulating pattern has a width measured in the first direction, and
the width of the each signal pad is larger than the width of the dummy insulating pattern.

15. The display panel of claim 1, wherein in the pad region,
the inclined edge of the display panel extends along a first direction,
the signal pad is extended in a diagonal direction crossing the first direction, and
the insulating layer extends from the signal pad to overlap the dummy pad which is connected the signal pad.

16. A display device, comprising:
a display panel including:
a display region including a pixel, and
a pad region which is adjacent to the display region and defines an inclined edge of the display panel which is furthest from the display region and exposed outside the display panel;
an electronic component connected to the display panel at the pad region thereof; and
a conductive adhesion film which electrically connects the electronic component to the display panel at the pad region thereof,
wherein the display panel comprises:
a base substrate defining an end surface of the base substrate which is furthest from the display region and exposed outside the display panel;
an insulating layer in the display region and the pad region; and
in the pad region:
a signal pad electrically connected to the pixel;
a dummy pad electrically connected to the signal pad;
the insulating layer which covers the signal pad and the dummy pad and defines an end surface of the insulating layer which is furthest from the display region and exposed outside the display panel, and
a first opening in the insulating layer which exposes the signal pad to outside the insulating layer and to outside the display panel,
wherein, in the pad region, the end surface of the base substrate and the end surface of the insulating layer together define the inclined edge of the display panel.

17. The display device of claim 16, wherein
the inclined edge of the display panel extends along a first direction, the pad region comprises:
- a first region corresponding to the signal pad, and
- a second region which is adjacent to the signal pad in the first direction, the electronic component comprises:
  - a plurality of protruding portions in direct contact with the pad region of the display panel, and
  - a plurality of gap portions respectively between the plurality of protruding portions, the plurality of protruding portions correspond to the first region, and the plurality of gap portions correspond to the second region.

18. The display device of claim 16, wherein
the electronic component comprises:
- a plurality of protruding portions in direct contact with the pad region of the display panel, and
- a plurality of gap portions respectively between the plurality of protruding portions, and the plurality of protruding portions are in contact with the signal pad.

19. The display device of claim 16, wherein the inclined edge of the display panel extends along a first direction, further comprising:
- the signal pad provided in plural, and the plurality of the signal pads comprising a first signal pad and a second signal pad arranged in the first direction, and
- the dummy pad provided in plural, and the plurality of the dummy pads comprising:
  - a first dummy pad corresponding to the first signal pad, and
  - a second dummy pad corresponding to the second signal pad and spaced apart from the first dummy pad in the first direction.

20. The display device of claim 19, further comprising:
- a second opening in the insulating layer at a position between the first dummy pad and the second dummy pad, and
- a dummy insulating pattern in the second opening.

* * * * *